United States Patent [19]

Ehlig et al.

[11] Patent Number: 5,101,498
[45] Date of Patent: Mar. 31, 1992

[54] PIN SELECTABLE MULTI-MODE PROCESSOR

[75] Inventors: Peter N. Ehlig; Roger W. Peters, both of Houston, Tex.

[73] Assignee: Texas Instruments Incorporated, Dallas, Tex.

[21] Appl. No.: 581,160

[22] Filed: Sep. 7, 1990

Related U.S. Application Data

[63] Continuation of Ser. No. 140,192, Dec. 31, 1987, abandoned.

[51] Int. Cl.$^5$ .................... G06F 13/00; G06F 9/00
[52] U.S. Cl. .................... 395/800; 364/232.9; 364/229; 364/229.2; 364/284; 364/222.2; 364/238; 364/DIG. 1
[58] Field of Search ... 364/200 MS File, 900 MS File, 364/578, 488, 489, 490, 491; 371/15.1, 20.1; 340/825; 307/465

[56] References Cited

U.S. PATENT DOCUMENTS

| | | | |
|---|---|---|---|
| 4,128,873 | 12/1978 | Lamiaux | 364/200 |
| 4,140,873 | 2/1979 | Kinch, Jr. et al. | 364/900 |
| 4,212,059 | 7/1980 | Sato et al. | 364/200 |
| 4,432,049 | 2/1984 | Shaw et al. | 364/200 |
| 4,435,762 | 3/1984 | Milligan et al. | 364/200 |
| 4,441,154 | 4/1984 | McDonough et al. | 364/200 |
| 4,453,211 | 6/1984 | Askinazi et al. | 364/200 |
| 4,470,113 | 9/1984 | Oura | 364/200 |
| 4,507,727 | 3/1985 | Magar | 364/200 |
| 4,514,805 | 3/1985 | McDonough et al. | 364/200 |
| 4,519,028 | 5/1985 | Olsen et al. | 364/200 |
| 4,545,013 | 10/1985 | Lyon et al. | 364/200 |
| 4,587,634 | 5/1986 | Ferrio et al. | 364/900 |
| 4,677,586 | 6/1987 | Magar et al. | 364/900 |
| 4,701,916 | 10/1987 | Naven et al. | 371/15.1 |
| 4,744,084 | 5/1988 | Beek et al. | 364/900 |
| 4,791,590 | 12/1988 | Ku et al. | 364/726 |
| 4,805,085 | 2/1989 | Mogi et al. | 364/132 |
| 4,851,994 | 7/1989 | Toda et al. | 364/200 |
| 4,868,784 | 9/1989 | Marshall et al. | 364/900 |
| 4,910,703 | 3/1990 | Ikeda et al. | 364/900 |

OTHER PUBLICATIONS

"On the Design of a High Performance LSI Circuit Digital Signal Processor for Communicatrion", Gambe et al.,-IEEE, Journal on Selected Areas in Communication, vol. SAC-3, No. 2, Mar. 1985, pp. 357-368.

"A 32-Bit VLSI Digital Signal Processor", Hays et al., IEEE Journal of Solid State Circuits, vol. SC-20, No. 5, Oct. 1985, pp. 998-1004.

"A 32b Floating Point CMOS Digital Signal Processor", Kawakami et al., 1986 IEEE International Solid-State Circuits Conference, pp. 86-87.

"A High Performance LSI Digital Signal Processor for Communication", Mochida et al.-IEEE Journal on Selected Areas in Communications, vol. SAC-3, No. 2, Mar. 1985, pp. 347-356.

"Architecture of High-Speed 22-Bit Floating-Point Digital Signal Processor", Mori et al., ICASSP 86, Tokyo, pp. 405-408.

"56-Bit General Purpose Digital Signal Processor", Motorola Inc., 1986, pp. 1-25.

UPD77230, NEC Electronics Inc., Feb. 1986, 16 pp.

"2920 Signal Processor" Intel, undated, pp. 4-43-50.

"Advanced Single-Chip Signal Processor", T. Nishitani et al., ICAASP86, Tokyo, IEEE, 1986, pp. 409-412.

NEC 1982 Catalog, pp. 551-567.

"Digital Signal Processor MB8764 Applications Manual", Fujitsu, 1986, pp. 1-4, p. 1-2.

DSP56000 Digital Signal Processor User's Manual, Motorola 1986, pp. 1-1, 2-9, 3-2, 3-7 to 3-9, 4-2 to 4-8, 4-14, 5-1 to 5-2, 7-1 to 7-36, 7-69 to 7-73, 8-1 to 8-9, 9-1 to 9-3.

*Primary Examiner*—Michael R. Fleming
*Assistant Examiner*—Gopal C. Ray
*Attorney, Agent, or Firm*—James F. Hollander; Rene' E. Grossman; Richard L. Donaldson

[57] ABSTRACT

A processor which has two different communications modes, a test mode, an an emulator mode is shown. These modes are selected by controlling inputs to two pins. More modes could be added with more pins. When a given mode is switched into, certain I/O pins instantly change function. Minimal hardware and software is required to implement a switch thus allowing rapid switches.

35 Claims, 7 Drawing Sheets

PIN SELECTABLE MULTI-MODE PROCESSOR

This application is a continuation, of application Ser. No. 07/140,192, filed Dec. 31, 1987, abandoned.

BACKGROUND AND SUMMARY OF THE INVENTION

This invention is in the field of microcomputers and microprocessors. More specifically, it is in the area of interfacing peripheral devices and/or other processors to the microcomputer or microprocessor.

A rapidly accelerating trend in the electronics industry is the increased demand for fast computational abilities. To try to meet this demand, the industry has introduced families of digital signal processing microcomputers, high-speed conventional microprocessors, and other fast processors. It is becoming apparent that one of the major bottlenecks in pushing for still higher speed is getting data in and out of the processor itself.

The industry has tried numerous approaches to solve this problem when memory access is the issue. Techniques such as pipelining, caching, etc. have been successfully employed. However one area that has not been adequately addressed is that of I/O to remote (i.e. off-chip) devices.

It is an object of the present invention to avoid creating an I/O bottleneck.

The vast majority of systems have a hardwired type of handshake between the microprocessor/microcomputer and the peripheral device. This handshake generally requires the processor to wait until the other device is ready during a read or a write operation. This in turn usually means that the reads and/or writes must be synchronous with the system clock.

It is an object of the present invention to allow a handshaking protocol, without forcing the processor to wait for the other device.

It is also an object of the invention to allow asynchronous reads and writes.

However, asynchronous communications are relatively slow. Ideally one would want to have the ability to communicate asynchronously with slow peripherals, but synchronously with fast ones. The normal disadvantage to this is the vastly increased number of I/O pins required.

It is an object of the invention to allow both asynchronous and synchronous communications.

It is also an object of the invention to minimize the number of I/O pins required.

It is a further object of the invention to allow rapid changes between communicating with slow peripherals and with fast peripherals.

Current I/O interfaces are designed to operated with fixed bus widths. If a processor has a 16 bit data bus, then peripherals are expected to be 16 bits in data width. This limits the number of devices that can be attached. In addition, if a 16 bit processor wishes to communicate with an 8 bit processor, added external logic is required.

It is an object of the invention to allow the processor to communicate with peripheral devices having varying data bus widths.

It is also an object of the invention to allow different processors having different data bus widths to communicate in a simple manner.

It is a further object of the invention to allow interface communications to occur with minimal external logic.

In some cases, it is desirable for the processor to operate in a master mode. This means that all communications occur in response to the processor's initiation. Conversely, there are situations where the processor should act as a slave to another system master. In the past, switches of this type required substantial setup overhead both in hardware and in software.

It is an object of the invention to allow the processor to to function in either a master or a slave environment.

It is also an object of the invention to allow rapid mode changes.

Technological advances in microprocessors/microcomputers have limited the market lifespan of any product. New processors are introduced that outdate the prior generation. To take advantage of the new features, a redesign of the entire product is frequently required.

It is an object of the invention to allow a product to be upgraded to a new processor generation without redesigning the product.

The processor vendor is also benefited. In the past, new generation processor would outdate his old line, making the line unprofitable to maintain. However, to support his customers, the vendor would have to keep stocking the old processor.

It is an object of the invention to allow the vendor to supply as a replacement part for an old generation product, a new generation part.

The vendor has another problem with new generations. Test patterns have been developed to exercise and qualify the old parts. These are highly timing dependent. When a new generation is introduced, the vendor normally has to create a whole new test pattern. This can also lead to difficulties in detecting subtle incompatibilities.

It is an object of the invention to allow the vendor to use the older generation product's test patterns.

These and other objects of the invention are achieved by a multi-mode processor having a plurality of I/O pins comprising:

a data bus coupled to selected ones of said I/O pins;

control lines coupled to other ones of said I/O pins;

said processor having a first communications mode wherein said data bus is selectively coupled to a first I/O port structure and said processor controls the input and output of data over said data bus;

said processor having a second communications mode wherein said data bus is selectively coupled to a second I/O port structure and the input and output of data over said data bus is controlled in response to said control lines; and said processor being switchable between said first and second communications modes in response to signals received on selected ones of said I/O pins.

DETAILED DESCRIPTION

Figure 1:
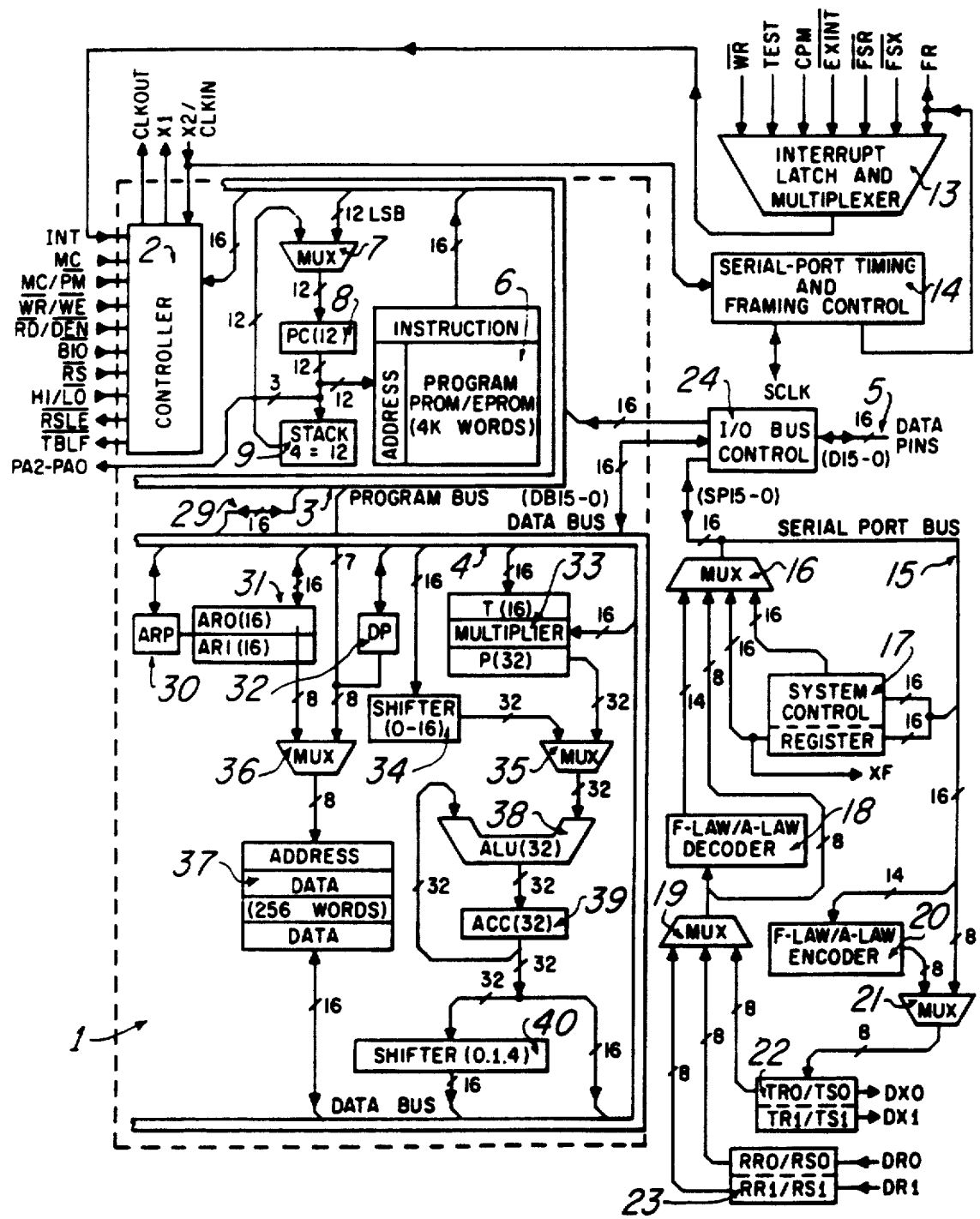
FIG. 1 is a block diagram of the processor employing the present invention.

FIG. 1 shows a simplified schematic of a processor employing the present invention. Block 1 represents the portion of the processor that composes a complete microcomputer such as a TMS320C15 manufactured by Texas Instruments, Inc. of Dallas, Tx. The architecture of this microcomputer is known as a modified Harvard architecture in that it has a bus for data and a separate bus for program memory. Cross-connect (29) allows data to move from the program bus (3) to the data bus (4) and vice-versa. This is what differentiates this architecture from a "pure" Harvard type. The remainder of the diagram represents additional peripheral circuitry located on-chip for speed and logic simplification purposes.

The control aspects of the processor are handled by the components generally surrounded by the program bus (3). These consist of the controller (2), multiplexor (7), program counter (8), stack (9), and program memory (6). In operation, the program counter (8) contains a 12 bit address of the instruction word to be used. This address is input to the addressing portion of program memory (6) causing the memory word to be retrieved and output onto program bus (3). The retrieved memory word is 16 bits. This in turn is input into the controller (2) for decode and execution. It should also be noted that the three least significant bits (LSB) of the address may also be output on lines PA2-PA0. The function of these, as well as other I/O of the controller (2), will be discussed later.

The multiplexor (7) is used to select an address from the program bus (3) or from the stack (9). The stack (9) is used for changing the instruction address in response to interrupts and/or subroutine returns.

Instructions for the controller (2) may also be loaded onto the program bus (3) from the I/O bus control (24). Data (D15-D0) is input to I/O bus control (24) from I/O bus (5). The ability to feed instructions onto program bus (3) from an external source is a feature of the invention that will be discussed below. I/O bus control (24) also serves to allow output and input of data between I/O bus (5), serial port bus (15) and data bus (4). Not shown in this figure are the control lines used by I/O bus control (24). These will be discussed in FIG. 5.

Calculations on data performed in the microcomputer portion (1) of the processor are handled by the components generally bounded by the data bus (4). Data for the operations is contained in the data memory (37). The address for the data in data memory (37) is input from the multiplexor (36). Multiplexor (36) selects the address from either one of the auxiliary registers (31) pointed to by the auxiliary register pointer (30), or from a seven bit address from the program bus (3) along with a data page pointer (32). The auxiliary registers (31) may also serve as loop control counters for repetitive instructions.

Data to be operated on flows through either the multiplier unit (33) or through the barrel shifter (34). Multiplexor (35) is used to select which result is to be fed into the arithmetic logic unit (ALU)(38). Also used as an input to the ALU (38) is the output from the accumulator (39). The result from ALU (38) is output to the accumulator (39). The accumulator (39) may then place the data onto the data bus (4) or into the parallel shifter (40).

As microcomputers have become more powerful, it has become more advantageous to include certain peripheral circuitry on the same chip. Particularly in high volumes, this can lead to a much more cost-effective approach for system design. In addition, by having the peripherals on-chip, performance may be enhanced as there are fewer (and faster) buffers involved. This leads to application specific types of microcomputers. The presently preferred embodiment of the invention is employed in such a device. It should be noted that the invention is not dependent on being used as an on-chip peripheral. In some embodiments, the invention may be located off chip. In other embodiments, the invention may be integral with the microcomputer or microprocessor itself.

On-chip with the microcomputer discussed above, are several peripherals. First is a serial port with companding functions. There is also a set of parallel ports and a passive co-processor interface. As will be explained, the passive co-processor interface uses the parallel ports and some other control lines to accomplish its functions.

The serial port consists of serial port receive registers (23), serial port transmit registers (22), multiplexors (21, 19, and 16), a decoder (18), an encoder (20), and a serial port controller (14). The two system control registers (17) are loaded from the I/O bus control (24) via serial port bus (15). As will be discussed, these two registers (17) are addressed by outputs PA2-PA0. In addition, there is a serial port timing and framing control block (14). SCLK is the serial port clock. DX0 and DX1 are the two serial port outputs while DR0 and DR1 are the serial port inputs.

CLKOUT is the system clock output. X2/CLKIN is the crystal input for the internal oscillator or may be an external oscillator system clock input. X1 serves as the crystal output for the internal oscillator.

In the present embodiment of the invention, there is a single interrupt (INT) that is used by the controller (2). However the functionality of interrupt (INT) is governed by the interrupt latch and multiplexor (13). As will be discussed when describing FIG. 5, considerable flexibility can be obtained. It should be noted that the internal interrupt (INT) is not an input from an external pin. The external inputs are input into the interrupt latch and multiplexor (13). These include EXINT__, FSR__, and FSX__.

Two inputs to the controller (2) are used to select various modes of the processor. These inputs (MC and MC/PM__) limit the number of possible modes to 4. While the present embodiment of the invention only uses these four modes, it should be understood by those skilled in the art that additional pins could be used if more modes were desired. In the presently preferred embodiment of the invention, these four modes are microcomputer (or normal mode), coprocessor, test, and emulator. The emulator mode has been fully described in co-pending application Ser. No. 07/093,463 now abandoned as a part of an (FWC) File Wrapper continuation application No. 07/440,454 is incorporated herein by reference.

Controller (2) decodes the MC and MC/PM__inputs and generates three additional control signals. Two of these signals (TEST and CPM) also serve as inputs to the interrupt latch and multiplexor (13). The third signal (EMU) will be discussed when describing FIG. 4.

EXINT\_ is the normal interrupt input. However, as will be discussed later, in some modes of the processor of the presently preferred embodiment of the invention, this input is disabled from being driven externally. FSR\_ is an input for the external receive serial port. FSX\_ is an input for the external transmit serial port. FR, as can be seen in FIG. 1, is both an output from the internal serial port for framing control (via serial port timing and framing control 14), and is also an input to the interrupt latch and multiplexor (13).

The other inputs to the controller (2) that are input from the external pins of the integrated circuit will now be discussed. The BIO\_input is used as a pollable input so that the processor can know when an external event has happened. Similar to EXINT\_discussed above, in some processor modes this input is disabled from being driven from an external device. However it is driven internally.

Likewise, the pin definitions for other inputs change depending on the processor mode. The WR\_/WE\_in- put serves as an external write control for the internal input latch when in coprocessor mode, but serves as the write enable for data when in the normal microcomputer mode. The RD\_/DEN\_input serves as the external read control for the output latch when in coprocessor mode and serves as the data enable for an external device read when in normal microcomputer mode.

The three output signals PA0, PA1, and PA2 serve as port select addresses. As stated earlier, the present embodiment of the processor of the invention has a set of parallel output ports. These three output lines allow a maximum of eight ports to be addressed. In the presently preferred embodiment of the processor, the allocation of the eight ports is six for the parallel ports and two for the system control registers (17). The system control registers (17) also handle the serial port functions.

However, in the coprocessor mode, these control lines (PA2-PA0) are used for other functions. PA0 turns into an input pin called HI/LO\_. The function of this pin will become clearer in the description of FIG. 4. The PA1 output becomes the RBLE\_output pin. This is used to signify that the receive buffer latch is empty. Similarly, the PA2 output becomes the TBLF\_output pin and is used to indicate that the transmit buffer latch is full. The use of these pins will become clearer when the coprocessor mode is discussed.

Figure 2:
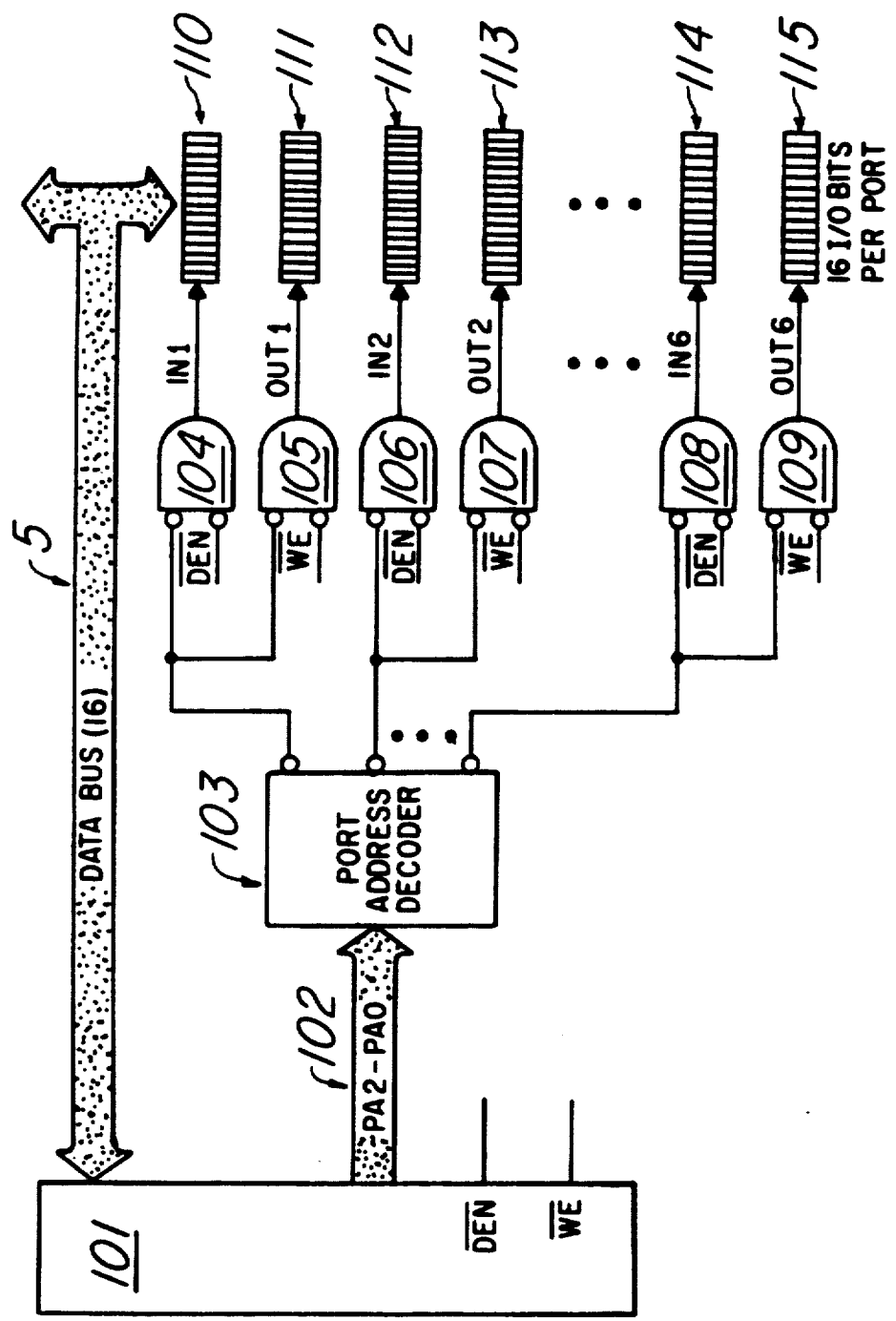
FIG. 2 illustrates how the parallel ports operate.

To better understand the differences between the normal microcomputer mode and the coprocessor mode, FIGS. 2 and 3 will be used. FIG. 2 illustrates the way in which the port select addresses (PA2-PA0) are used. Processor 101 encompasses the processor illustrated in FIG. 1 above. External data bus (5) is the continuation beyond the data pins as shown in FIG. 1. The port select bus (102) has the port select addresses PA2-PA0. These are decoded by the port address decoder (103) which may, for example be a 74LS137 as manufactured by Texas Instruments, Inc. of Dallas, Tex.

AND gates (104-109) are selected by the port address decoder (103). When the appropriate strobe is also received (either data enable DEN\_or write enable WE\_), then the desired data (blocks 110-115) is latched onto, or taken from the 16 bit data bus (5). Thus, I/O is treated as a memory mapped device.

This method of data transfer is well known in the art. However, there are some disadvantages to it. The biggest problem is that the peripheral device must keep up with the processor. If it does not, then the processor is forced to wait. In high-speed environments, this is unacceptable.

The present invention employs an additional mode of data transfer. This is known as the coprocessor mode. It should be noted that while the presently preferred embodiment of the invention uses this mode for data transfer between different processors of varying speed, the invention is not limited to this. In many cases the invention will be used where any slow peripheral is employed. The processor can continue at full speed doing another task. When the peripheral has the data, or requires data, the processor can then respond. It does not have to wait for the data as in conventional systems.

As was illustrated above, the conventional method of data transfer assumes that the data coming in is 16 bits in parallel. This is not always the case. For example, some 16 bit processors (such as the INTEL 8088) use an eight bit bus even while transferring 16 bit data. In the conventional scheme above, this presents some additional logic that must be added. In contrast, the present invention allows different lengths to be used for coprocessor mode than for normal data transfer. This is the function of the HI/LO\_pin mentioned earlier. Thus, the coprocessor port of the present embodiment of the invention provides a direct interface to most 4/8-bit microcomputers and 16/32 bit microprocessors.

In the presently preferred embodiment of the invention, the port is accessed through I/O bus 5 using IN and OUT instructions. The coprocessor interface allows the device to act as a peripheral (slave) microcomputer to a microprocessor, or as a master to a peripheral microcomputer such as the TMS7042. The coprocessor port is enabled by setting MC/PM and MC to low. The microcomputer mode is enabled by setting these two pins high.

In general, the multi-mode process of the invention has a predetermined number of mode select connectors. The multi-mode processor further has a number of I/O connectors coupled to a data bus. First and second peripheral devices are coupled to this data bus. The multi-mode processor has a plurality of communications modes selectable in response to external signals on the mode select connectors. The first peripheral device is operable to communicate with the multi-mode processor when the multi-mode processor is in a first communication mode. The second peripheral device is operable to communicate with the multi-mode processor when the multi-mode processor is in a second communications mode. The first peripheral device may be a processor, and the second peripheral device can be a processor as well. The mode select connectors may be coupled to the second peripheral device, with the multi-mode processors switching communications modes in response to signals placed on the mode select connectors by the second peripheral device. Communication to the multi-processor may be done by the use of data of different predetermined data widths.

Thus the processor can instantly be reconfigured between these two modes. As mentioned earlier, the test and emulation modes can also be instantly switched to. This multi-mode capability has several advantages. First, the processor can be functioning as a conventional microcomputer where it is communicating with high-speed peripherals. When it needs to communicate to slower devices, or a device with a different data width size, it can instantly switch (or be switched by the slower device) into the coprocessor mode. Secondly, because many pin functions can be instantly changed by the invention, a product line can be upgraded to an enhanced processor without losing pin compatibility with the old processor. Third, a manufacturer does not have to build multiple parts with different I/O structures. This allows the vendor to sell the same product to multiple clients (with differing needs) thus increasing volume and lowering costs. The advantages to also being able to switch to test or emulation modes, while discussed later, additionally serve to reduce cost.

In coprocessor mode, the 16-bit data bus is reconfigured to operate as a 16-bit latched bus interface. In the presently preferred embodiment of the invention, control bit 30 (CR30) in system control register 1 (17 of FIG. 1) is used to configure the coprocessor port to either an 8-bit or a 16-bit length for data transfer. When CR30 is high, the coprocessor port is 16 bits wide, thereby making all 16 bits of the data port available for 16-bit transfers to to 16/32-bit microprocessors. When CR30 is low, the port is 8 bits wide and mapped to the low byte of the data port for interfacing to 4/8 bit microcomputers. When operating in the 8 bit mode, both halves of the 16 bit latch d by the external device using the HI/LO pin (301 of FIG. 3A and 305 of FIG. 3B), thus allowing the 16-bit transfers over 8 data lines. This requires two external bus cycles but only one internal port access. When not in the coprocessor mode, port 5 can be used as a generic I/O port.

Figure 3A:
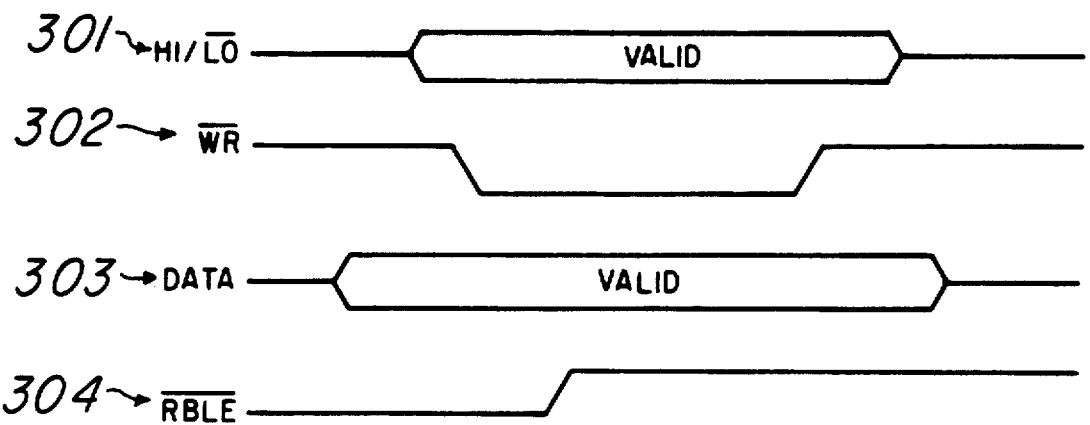
FIGS. 3A and 3B shows the timing diagrams for the coprocessor mode.
Figure 3B:
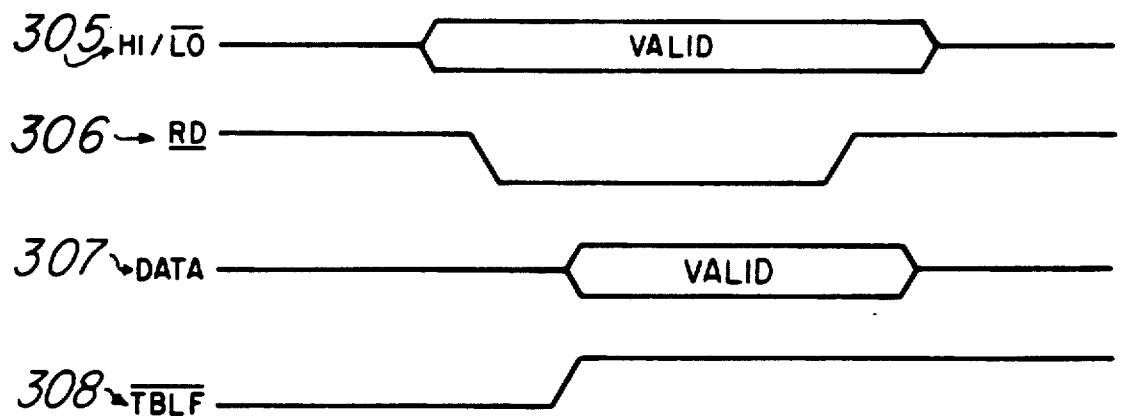

Interprocessor (or between processor and device) communication through the coprocessor interface is accomplished asynchronously as in memory-mapped I/O operations. This is illustrated in FIGS. 3A and 3B. For a write to the presently preferred embodiment of the processor, the external processor lowers the WR__ line (302) and places data (303) on the bus (5 of FIG. 1). It then raises the WR__line (302) to clock the data into the on-chip latch. The falling edge of WR__(302) clears the RBLE__(receive buffer latch empty) flag (304), and the rising edge of WR__(302) automatically creates the equivalent of an EXINT__interrupt to the processor. Note that when reading or writing in the 8 bit mode, accesses to the high byte will not activate an interrupt or BIO__.

Turning to FIG. 3B, the external processor reads from the latch by driving the RD__line (306) active low, thus enabling the output latch to drive the latched data (307). When the data (307) has been read, the external device will again bring the RD__line (306) high. This activates the internal BIO__line (of FIG. 1) to signal that the transfer is complete and the latch is available for the next transfer. The falling edge of RD__(306) resets the TBLF__(transmit buffer latch full) flag (308). Note that, as discussed above, the EXINT__and BIO__lines are reserved for coprocessor interface and cannot be driven externally when in the coprocessor mode.

Figure 4A:
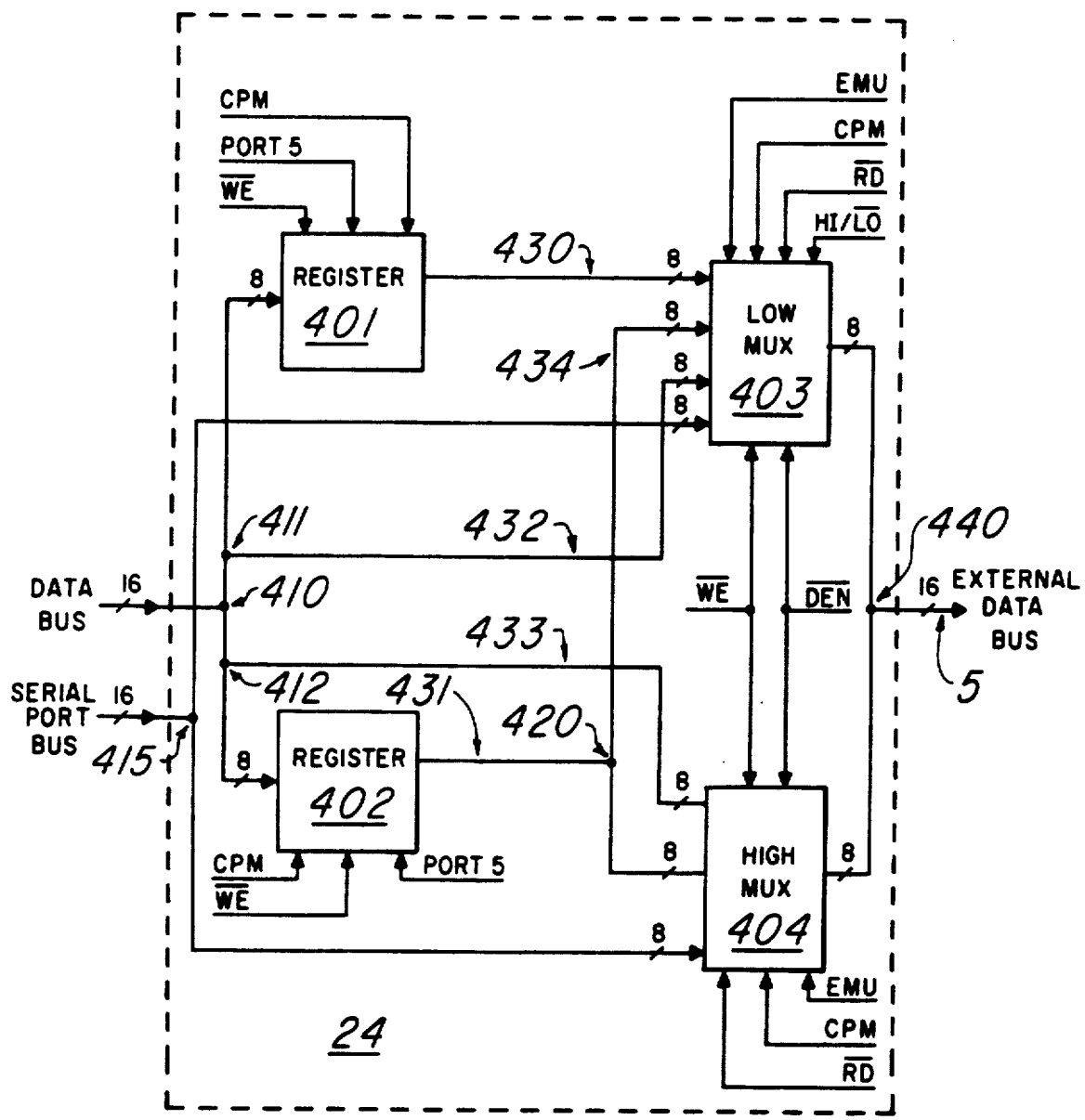
FIG. 4A shows the output structure of the I/O bus control.

FIG. 4A illustrates the internal configuration of the I/O bus control (24 of FIG. 1) when it is set for output. In the presently preferred embodiment, the I/O bus control comprises 4 major components. There are two 8 bit registers (401 and 402) used for the coprocessor mode, and two 8 bit multiplexors (403 and 404) used in all modes. It should be noted that the signal names given are those that are used internally. Consequently one should not get confused when seeing two different signal names that represent a common pin (for example RD__and DEN__). If the processor is not in the right mode for these signals to be used, they are ignored.

Data can come into the I/O bus control either from the serial port bus or from the internal data bus. In either event, these are 16 bit buses.

At 415 and 410, the serial port bus and the data bus respectively bifurcate into two 8 bit buses (one for the high-order bits and one for the low order bits). This is done because the external data bus (5) can operate in an 8 bit fashion when in coprocessor mode. Tracing the serial port bus first, it can be seen that the low order bits go into the low multiplexor (403) and the high order bits go into the high multiplexor (404). When the DEN__signal goes active, the data is output from the multiplexors (403 and 404), combined back into 16 bit wide data, and output on external data bus (5). In the presently preferred embodiment of the invention, the DEN__signal is allowed to control the serial data output only when in the emulator or normal microcomputer mode.

Data from the data bus has a more complex path. At points 411 and 412, the data bus data is routed to both the registers (401 and 402) and to the multiplexors (403 and 404). If the processor is in either the normal microcomputer mode or test mode, then the multiplexors (403 and 404) will select the data from buses 432 and 433. The WE__signal is then used to place the data onto the external data bus (5) as above.

If the coprocessor mode is selected (CPM active) and the correct port is selected (PORT5), the data will be input to the registers (401 and 402). Upon the internal write enable (WE__) generated by an OUT instruction, data will be placed onto buses 430 and 431. Since CPM is active, the multiplexors (403 and 404) will look for data on these buses. In 16 bit mode, the RD__signal will then place the data onto the external data bus (5) as above.

However, if the 8 bit mode is selected, then data can only appear on the low order 8 bits of external data bus (5). The external processor changes the state of the HI/LO__input to low multiplexor (403). This causes the multiplexor (403) to read the high order bits that were also placed on bus 434 and output them to external data bus (5). While other mechanisms are possible, in the present embodiment of the invention, the high order byte is read first by asserting RD__low, then RD__is brought back high. Following is the read of the low order byte into multiplexor (403) which is done by first switching HI/LO__and then reasserting RD__as low. The switching of RD__back to high relinquishes control of the buses.

The emulation signal (EMU) is used to output the serial port bus contents onto the external data bus (5). This mode is designed so as to allow real-time emulation of the processor and testing of the serial port operation. As stated above, this feature is covered fully in copending application Ser. No. 07/093,463 which is incorporated herein by reference.

Figure 4B:
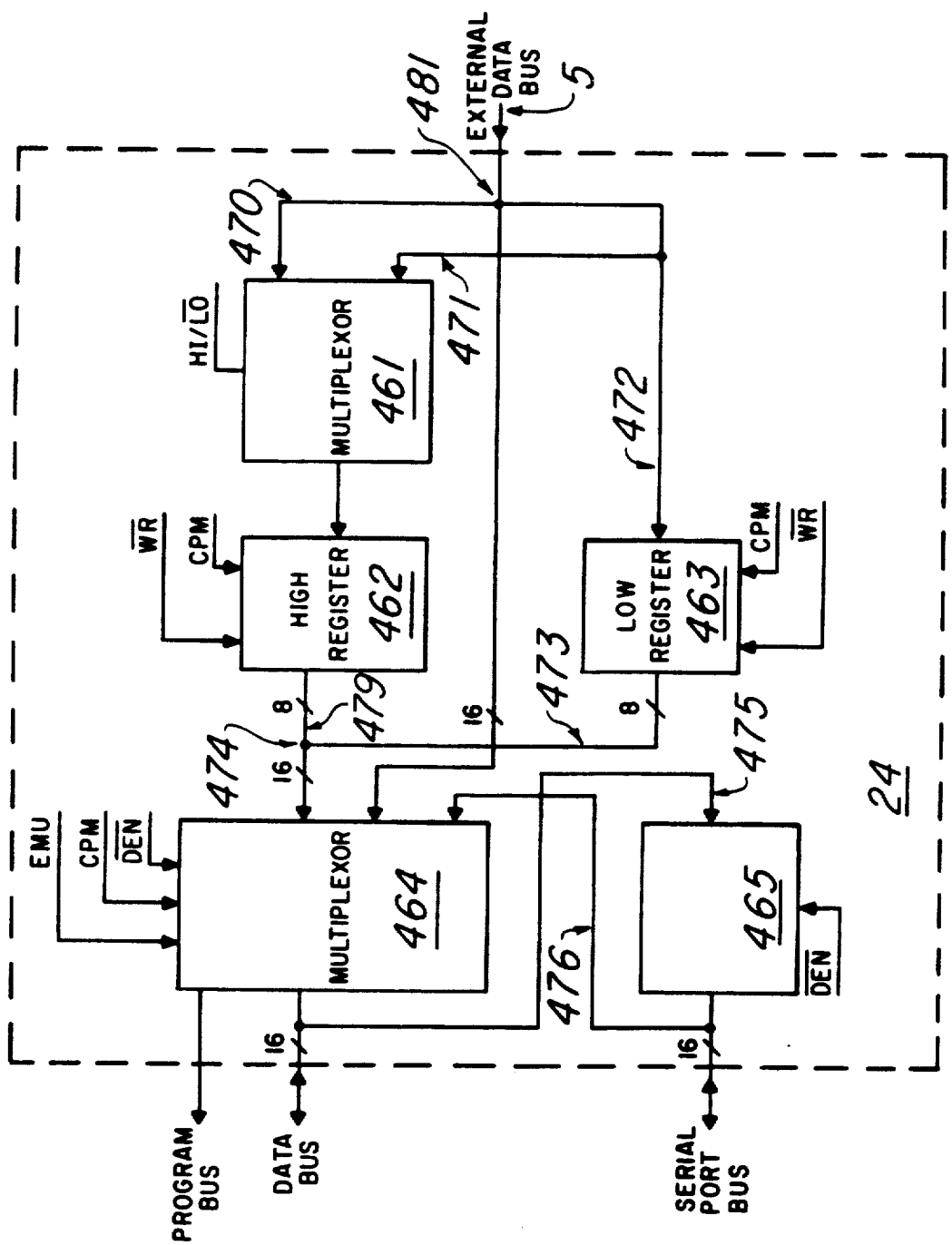
FIG. 4B shows the input structure of the I/O bus control.

FIG. 4B illustrates the structure of the I/O bus control block (24) when used in input mode. Data paths are easily followed when in normal microcomputer mode or when in emulation mode. In these cases, data (16 bits wide) comes in from external data bus (5) and arrives at multiplexor (464). In microcomputer mode, the DEN__ signal is used to place data from bus 5 onto the data bus. If in emulation mode (EMU active), then the data is either routed to the program bus (if DEN__is high) or to the data bus (if DEN__is low).

Again, in coprocessor mode, the routing is more complex. For a 16 bit mode, incoming data on bus (5) is bifurcated at point 481 into low order bits (on bus 472)

and high-order bits (on bus 470). Data on bus 472 is allowed to enter the low register (463) as CPM is active. Similarly, multiplexor (461) will allow data on bus 470 to enter high register (462). Upon signal from WR__, the data is output onto the respective output buses (473 and 479) where it is combined back into a 16 bit path (474). This then enters multiplexor (464).

For eight bit transfers from the external data bus (5), the HI/LO__signal is used to reroute the actual high-order bits back from the low-order bus (472) via bus (471) and multiplexor (461). The rest of the transfer is the same.

Multiplexor (464) also includes some additional logic that is used to decide which of its inputs (474, 476, or 481) to use. This is based on which port has been addressed. When in coprocessor mode, where port 5 is the normal port, ports 1 and 2 can also be addressed. This is because they represent on-chip peripherals (in this case the system control registers). When multiplexor (464) detects these two ports as being addressed, multiplexor (464) will select bus 476 as the input and route data onto the data bus. In this way, data can be transferred from the serial port bus to the data bus. Similarly, when port 5 is selected, multiplexor 464 will select bus 474 as the input to be passed onto the data bus.

Data is transferred from the data bus to the serial port bus by operation of bus (475) and tri-state driver block (465). When the DEN__signal is low, the driver (465) is turned off and will not allow data on bus 475 to be transferred. When the DEN__signal is high, data is allowed to flow from the data bus to the serial port data bus.

Figure 5:
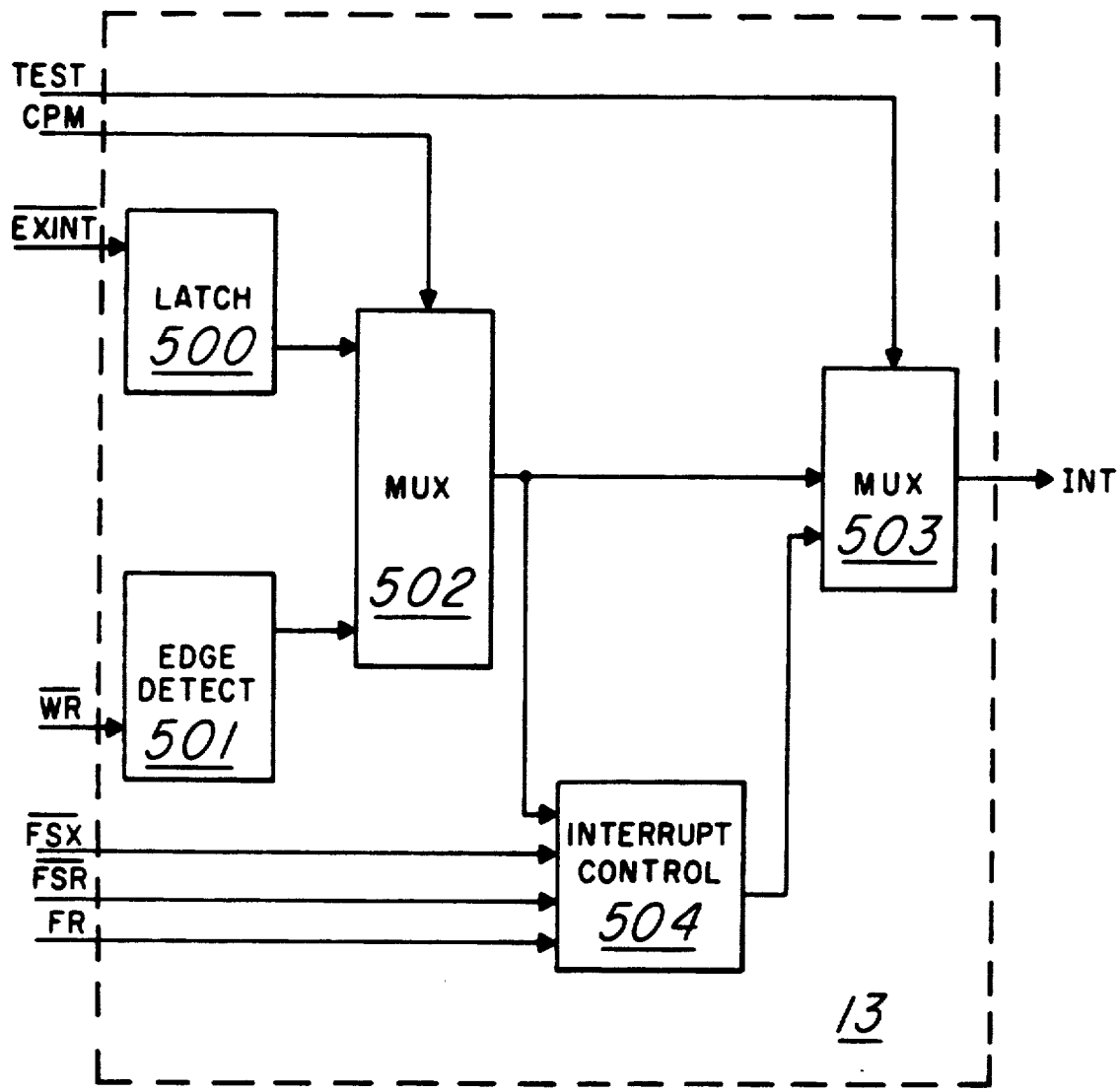
FIG. 5 is a block diagram of the interrupt latch and multiplexor block.
Figure 6:
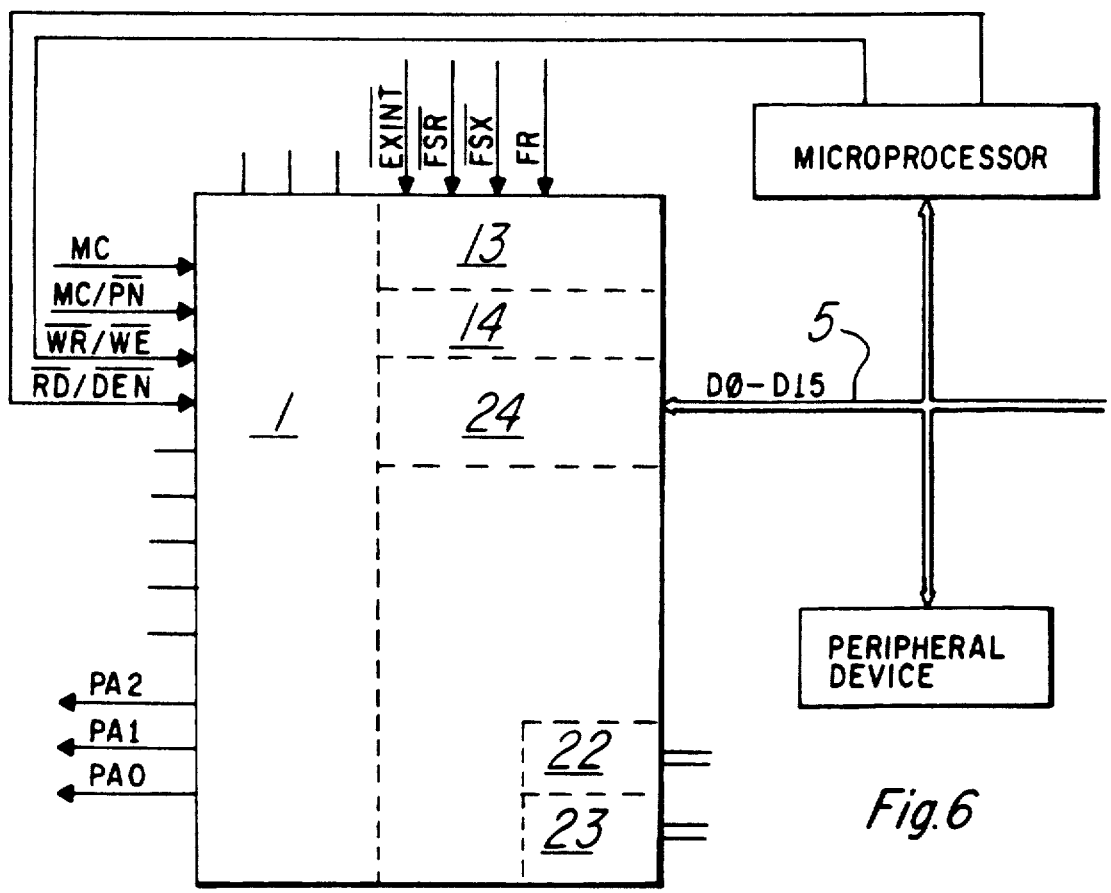
FIG. 6 is a highly schematic block diagram of a processor according to the invention as connected in a system to a second microprocessor and another peripheral device.

FIG. 5 illustrates the internal operation of the interrupt latch and multiplexor (13 of FIG. 1). The normal external interrupt (EXINT__) is latched into latch (500). This in turn is input to multiplexor (502). The other input to the multiplexor (502) is derived from the WR__ signal. As was discussed previously, in coprocessor mode, the system relies on detecting the transition of WR__. Therefore the edge detection circuit (501) is employed. The CPM signal (which signifies whether the processor is in coprocessor mode or not) is used to select which signal (EXINT__or the edge detection from WR__) is output. This is also why the EXINT__signal is disconnected in coprocessor mode.

Three additional potential interrupt signals are also provided for. These are the FSX__signal, the FSR__signal, and the FR signal. All of these relate to the serial port of the present embodiment of the processor. These signals, plus the output from multiplexor (502) are input to the interrupt control (504). This block allows the user to select (via a mask) which interrupts he would like to be interrupted on.

A primary rationale for the invention is cost reduction. This has been achieved by allowing back-compatibility with older processors. The TEST input in to the interrupt latch and multiplexor is another example of this. In older generations of products, certain features may not be present. However extensive test patterns have been developed. The present invention allows these patterns to be used on later generation products.

In order to use these patterns, timing must be identical to the older generations. The TEST input controlling multiplexor (503) does this. Prior generations did not have the added interrupt control functions. Therefore, when TEST is activated, these functions are bypassed.

This same technique could be used to bypass major logic sections, add some slower circuitry if necessary, change pin configurations, or otherwise eliminate incompatibility. This sharply reduces the cost to the vendor as he does not have to generate new test patterns. In addition, it ensures that the customer can have an exact replacement part, even several generations later. Further, the customer is ensured of no incompatibilities that may escape new and different test patterns.

While certain presently preferred embodiments of the invention have been discussed, these are intended merely as illustrative. Other embodiments of the invention are possible without departing from the scope of the invention. All defined in the claims below.

What is claimed is:

1. A multi-mode processor having a plurality of I/O pins comprising:
a data bus coupled to a first set of said I/O pins;
control lines coupled to a second set of said I/O pins;
data processing circuitry coupled to said data bus;
mode decode circuitry coupled to a third set of said I/O pins;
bus control circuitry having a first communications mode wherein said data bus is connected to the first set of said I/O pins and said data processing circuitry controls the input and output of data over said data bus;
said bus control circuitry having a second communications mode wherein said data bus is latched and the input and output of data over said data bus via the first set of said I/O pins is controlled in response to external signals received on said control lines from said second set of I/O pins;
said bus control circuitry being switchable between said first and second communications mode in response to signals decoded from said third set of said I/O pins by said mode decode circuitry; and
said bus control circuitry further having an emulator mode, a fourth set of I/O pins, said bus control circuitry also being switchable to the emulator mode wherein data received on said fourth set of I/O pins is switched to appear on said first set of I/O pins in response to signals decoded by said mode decode circuitry.

2. The multi-mode processor as claimed in claim 1, wherein said bus control circuitry further has a test mode, said bus control circuitry also being switchable to the test mode in response to signals decoded by said mode decode circuitry.

3. The multi-mode processor as claimed in claim 1, wherein said data bus, data processing circuitry, mode decode circuitry and bus control circuitry are all on a single chip.

4. The multi-mode processor as claimed in claim 1, further comprising a serial port, and a serial port bus connecting said bus control circuitry to said serial port, said bus control circuitry multiplexing said serial port bus to said data bus.

5. A multi-mode processor having a plurality of I/O pins, comprising:
a data bus coupled to a first set of said I/O pins;
control lines coupled to a second set of said I/O pins;
data processing circuitry coupled to said data bus;
mode decode circuitry coupled to a third set of said I/O pins;
bus control circuitry having a first communications mode wherein said data bus is connected to the first set of said I/O pins and said data processing circuitry controls the input and output of data over said data bus;

said bus control circuitry having a second communications mode wherein said data bus is latched and the input and output of data over said data bus via the first set of said I/O pins is controlled in response to external signals received on said control lines;

said bus control circuitry being switchable between said first and second communications mode in response to signals decoded from said third set of said I/O pins by said mode decode circuitry;

said bus control circuitry further having an emulator mode, a fourth set of I/O pins, said bus control circuitry also being switchable to the emulator mode wherein data received on said fourth set of I/O pins is switched to appear on said first set of I/O pins in response to signals decoded by said mode decode circuitry; and said bus control circuitry, in response to signals decoded by said mode decode circuitry, changing the functions of predetermined ones of said I/O pins.

6. A multi-mode processor having a plurality of I/O pins, comprising:

mode decode circuitry coupled to some of said I/O pins and operable to transmit a test signal responsive to a predetermined combination of states on preselected ones of said I/O pins;

processor control circuitry selectively operable to assume a normal mode and a test mode, said processor control circuitry assuming said test mode in response to said test signal from said mode decode circuitry, said processor control circuitry including a subcircuit embodying a processor control function; and said test mode deactivating said subcircuit, wherein test patterns generated for a different processor not having said subcircuit may be executed in an identical manner by said processor as compared to said different processor.

7. A multi-mode processor having a plurality of I/O pins, comprising:

mode decode circuitry coupled to some of said I/O pins and operable to issue a test signal responsive to a predetermined combination of states on preselected ones of said I/O pins; and processor control circuitry selectively operable to assume a normal mode and a test mode, said processor control circuitry assuming said test mode in response to said test signal from said mode decode circuitry, a multiplexer of said processor control circuitry coupled to said predetermined I/O pins and said mode decode circuitry operative in said test mode to ignore the state of said predetermined ones of said I/O pins.

8. A computing system comprising:

a multi-mode processor having a predetermined number of mode select connectors;

said multi-mode processor further having I/O connectors coupled to a data bus;

a first peripheral device coupled to said data bus;

a second peripheral device coupled to said data bus, said mode select connectors of said multi-mode processor connected to said second peripheral device;

said multi-mode processor having a plurality of communications modes selectable in response to signals placed on said mode select connectors by said second peripheral device;

said first peripheral device operable to communicate with said multi-mode processor when said multi-mode processor is in a first one of said communications modes; and said second peripheral device operable to communicate with said multi-mode processor when said multi-mode processor is in a second one of said communications modes.

9. The computing system as claimed in claim 8, wherein said first peripheral device is a memory.

10. The computing system as claimed in claim 8, wherein said second peripheral device is a processor.

11. The computing system as claimed in claim 8, wherein said first peripheral device includes a memory and said second peripheral device includes a data processing device; and said multi-mode processor having an emulator mode as a third communications mode and operable to switch between communications mode in response to signals placed on said mode select connectors by said second peripheral device.

12. The computing system as claimed in claim 8, wherein said second communications mode is asynchronous.

13. The computing system as claimed in claim 8, further comprising address-mapped I/O circuitry connected to said I/O connectors of said multi-mode processor.

14. A computing system comprising:

a multi-mode processor having a predetermined number of mode select connectors;

said multi-mode processor further having I/O connectors coupled to a data bus;

a first peripheral device coupled to said data bus;

a second peripheral device coupled to said data bus, said mode select connectors of said multi-mode processor are connected to said second peripheral device;

said multi-mode processor having a plurality of communications modes selectable in response to signals placed on said mode select connectors by said second peripheral device;

said first peripheral device operable to communicate with said multi-mode processor when said multi-mode processor is in a first one of said communications mode;

said second peripheral device operable to communicate with said multi-mode processor when said multi-mode processor is in a second one of said communications modes; and said first peripheral device communicating with said multi-mode processor by use of data of a predetermined data width and said second peripheral device communicating with said multi-mode processor using data of a different data width.

15. A processing apparatus comprising:

means for electronically performing computations;

I/O means for input and output of digital data to and from said means for electronically performing computations;

controller means having external mode inputs and control pins, said controller means including means for decoding said mode inputs and connected to said I/O means to establish at least first and second different modes for controlling said I/O means depending on the mode inputs wherein one of the control pins comprises a write enable output in the first mode and an external write control input in the second mode and a second of the control pins comprises a data enable output in the first mode and an external read control input in the second mode; and wherein said I/O means includes a receiver buffer latch and a transmit buffer latch, and wherein a third one of the control pins comprises a first address output in the first mode and a receive buffer latch empty output in the second mode and a fourth one of the control pins comprises a second address output in the first mode and a transmit buffer latch full output in the second mode.

16. A processing apparatus as set forth in claim wherein a further one of the control pins comprises an address output in the first mode and a high-low byte select input in the second mode.

17. A processing apparatus as set forth in claim 15, wherein said mode inputs are at least two in number and at least four different modes are established depending on said mode inputs, the modes also including a third emulator mode and a fourth test mode.

18. A processing apparatus comprising:
first means for electronically performing computations;
second means including a receive buffer latch and a transmit buffer latch for input and output of digital data to and from said means for electronically performing computations; and
controller means having external mode inputs and control terminals, said controller including means for decoding said mode inputs and connected to said second means to establish at least first and second modes depending on the mode inputs for controlling said second means wherein one of the control terminals comprises an address output in the first mode and the same one of the control terminals comprises a receive buffer latch empty output in the second mode and a second of the control terminals comprises a second address output in the first mode and a transmit buffer latch full output in the second mode.

19. A processing apparatus comprising:
means for electronically performing computations;
I/O means for input and output of digital data to and from said means for electronically performing computations; and
controller means having a mode input pin and a control pin, said controller means including means responsive to said mode input and connected to said I/O means to establish at least first and second different modes for controlling said I/O means depending on the mode input and said control pin comprises an address output in the first mode and a high-low byte select input in the second mode.

20. A processing apparatus comprising:
means for electronically performing computations;
I/O means for input and output of digital data to and from said means for electronically performing computations; and
controller means coupled to said means for electronically performing computations and said I/O means having a mode input, an external interrupt input and a pollable input, said controller means including means responsive to said mode input to establish at least first and second modes for controlling said I/O means depending on the mode input and means for disabling the external interrupt input and the pollable input in the second mode but not the first mode, leaving said pollable input to be driven internally in the second mode.

21. A computing system comprising:
a multi-mode processor having a mode pin, control pins and I/O pins; and
peripheral means connected to said mode pin and control pins of said multi-mode processor for sending a mode signal to said mode pin of said multi-mode processor thereby establishing at least first and second different modes for controlling operations of said multi-mode processor at said I/O pins, one of the control pins comprising a write enable output in the first mode and an external write control input from said peripheral means in the second mode, and a second of the control pins comprising a data enable output in the first mode and an external read control input in the second mode.

22. A method of operating processing apparatus having pins connected to a peripheral device, the method comprising the steps of:
supplying signals from the peripheral device to at least one of the pins, representing at least first and second modes of operation desired of the processing apparatus; and
establishing at least a first I/O mode for direct communication and a second I/O mode for latched bus communication in the processing apparatus depending on the signals wherein a first additional one of the pins is made to be an address output pin in the first mode and a receive buffer latch empty output to the peripheral device in the second mode and a second additional one of the pins is made to be another address output in the first mode and a transmit buffer latch full output in the second mode, the first and second additional pins changing their function when the first or second mode is changed in the processing apparatus.

23. A data processing device comprising:
a first set of pins and mode decode circuitry connected to said first set of pins as mode inputs, said mode decode circuitry having a set of mode outputs decoded from the inputs and exceeding the inputs in number;
digital processor circuitry for processing digital data; and
a second set of pins, communications control circuitry connected between said digital processor circuitry and said second set of pins to communicate digital data in parallel digital form therebetween, said communications control circuitry including a register circuit and a multiplexer connected to each other and responsive to said mode outputs of said mode decode circuitry to operate in at least three modes wherein a first mode connects the digital processor circuitry to the second set of pins and the second mode interposes the register circuitry between the digital processor circuitry and the second set of pins, wherein a third mode is preselected from a test mode and an emulator mode 24. The data processing device of claim 23, further comprising a serial port, said communication control circuitry being responsive to said mode outputs of said mode decode circuitry to connect said serial port to said digital processor circuitry.

25. The Data processing device of claim 23, further comprising a serial port, said communication control circuitry being responsive to said mode outputs of said mode decode circuitry to connect said serial port to said second set of pins.

26. The data processing device of claim 23, wherein said communication control circuitry includes I/O bus control circuitry connected between said digital processor circuitry and said second set of pins, and further includes interrupt control circuitry to which said digital processor circuitry is responsive upon interrupt.

27. The data processing device of claim 26, wherein said interrupt control circuitry is connected to at least two of said mode outputs of said mode decode circuitry.

28. A data processing device comprising:
a first set of pins and mode decode circuitry connected to said first set of pins as mode inputs, said mode decode circuitry having a set of mode outputs decoded from the inputs and exceeding the inputs in number;
digital processor circuitry for processing digital data and having a data bus and a program bus;
a second set of pins, communications control circuitry connected between said digital processor circuitry and said second set of pins to communicate digital data in parallel digital form therebetween, said communications control circuitry including a register circuit and a multiplexer connected to each other and responsive to said mode outputs of said mode decode circuitry to operate in at least three modes wherein a first mode connects the digital processor circuitry to the second set of pins and the second mode interposes the register circuit between the digital processor circuitry and the second set of pins; and
said communication control circuitry responsive to said mode outputs of said mode decode circuitry in a third of said three modes to connect the program bus to said second set of pins.

29. A multi-mode processor having a plurality of I/O pins, comprising:
a data bus coupled to a first set of said I/O pins;
control lines coupled to a second set of said I/O pins;
data processing circuitry coupled to said data bus;
mode decode circuitry coupled to a third set of said I/O pins and establishing a number of communications nodes greater than the number of pins in the third set of said I/O pins;
bus control circuitry having a first communications mode wherein said data bus is connected to the first set of said I/O pins and said data processing circuitry controls the input and output of data over said data bus;
said bus control circuitry having a second communications mode wherein said data bus is latched and the input and output of data over said data bus via the first set of said I/O pins is controlled in response to external signals received on said control lines from said second set of I/O pins;
said bus control circuitry being switchable between said first and second communications mode in response to signals decoded from said third set of said I/O pins by said mode decode circuitry;
said bus control circuitry further having an emulator mode, a fourth set of I/O pins, said bus control circuitry also being switchable to the emulator mode wherein data received on said fourth set of I/O pins is switched to appear on said first set of I/O pins in response to signals decoded by said mode decode circuitry; and said mode decode circuitry establishing a number of communications modes exceeding in number the number of pins in the third set of said I/O pins.

30. A multi-mode processor having a plurality of I/O pins comprising:
a data bus coupled to a first set of said I/O pins;
control lines coupled to a second set of said I/O pins;
data processing circuitry coupled to said data bus;
mode decode circuitry coupled to a third set of said I/O pins establishing communications modes equal in number of two-to-a-power where the power is the number of pins in the third set of said I/O pins;
bus control circuitry having a first communications mode wherein said data bus is connected to the first set of said I/O pins and said data processing circuitry controls the input and output of data over said data bus;
said bus control circuitry having a second communications mode wherein said data bus is latched and the input and output of data over said data bus via the first set of said I/O pins is controlled in response to external signals received on said control lines from said second set of I/O pins;
said bus control circuitry being switchable between said first and second communications mode in response to signals decoded from said third set of said I/O pins by said mode decode circuitry;
said bus control circuitry further having an emulator mode, a fourth set of I/O pins, said bus control circuitry also being switchable to the emulator mode wherein data received on said fourth set of I/O pins is switched to appear on said first set of I/O pins in response to signals decoded by said mode decode circuitry; and
said mode decode circuitry establishing communications modes equal in number of two-to-a-power where the power is the number of pins in the third set of said I/O pins.

31. A multi-mode processor having a plurality of I/O pins comprising:
a data bus coupled to a first set of said I/O pins;
control lines coupled to a second set of said I/O pins;
data processing circuitry coupled to said data bus;
mode decode circuitry coupled to a third set of said I/O pins;
bus control circuitry having a first communications mode wherein said data bus is connected to the first set of said I/O pins and said data processing circuitry controls the input and output of data over said data bus;
said bus control circuitry having a second communications mode wherein said data bus is latched and the input and output of data over said data bus via the first set of said I/O pins is controlled in response to external signals received on said control lines from said second set of I/O pins;
said bus control circuitry being switchable between said first and second communications mode in response to signals decoded from said third set of said I/O pins by said mode decode circuitry;
said bus control circuitry further having an emulator mode, a fourth set of I/O pins, said bus control circuitry also being switchable to the emulator mode wherein data received on said fourth set of I/O pins is switched to appear on said first set of I/O pins in response to signals decoded by said mode decode circuitry; and address-mapped I/O circuitry connected to said bus control circuitry via said data bus.

32. A computing system comprising:
a first data processing device;
a peripheral device; and
a second data processing device including a first set of pins connected to said first data processing device and mode decode circuitry connected to said first set of pins as mode inputs, said mode decode circuitry having a set of mode outputs decoded from the inputs and exceeding the inputs in number; digital processor circuitry for processing digital data; and a second set of pins and communications control circuitry connected between said digital processor circuitry and said second set of pins to communicate digital data in parallel digital form therebetween, said second set of pins coupled to both said first data processing device and to said peripheral device, and said communications control circuitry including a register circuit and a multiplexer connected to each other and responsive to said mode outputs of said mode decode circuitry to operate in at least three modes wherein a first mode connects the digital processor circuitry to the second set of pins and the second mode interposes the register circuit between the digital processor circuitry and the second set of pins wherein a third mode is preselected from a test mode and an emulator mode.

33. The computing system as claimed in claim 32 wherein said first data processing device comprises a general purpose microprocessor.

34. The computing system as claimed in claim 32, wherein said first mode is a normal microprocessor mode, said second mode is a coprocessor mode and said third mode is an emulator mode.

35. A multi-mode processor having a plurality of I/O pins, comprising:
mode decode circuiry coupled to some of said I/O pins and operable to generate a test signal in response to at least one predetermined state of at least one of the last said I/O pins; and
processor control circuitry coupled to said mode decode circuitry for receiving said test signal, said processor control circuitry further receiving a plurality of second signals external to said multi-mode processor, said processor control circuitry generating an interrupt signal as a logical function of the states of said second signals and the state of said test signal.

* * * * *